US008558779B2

(12) United States Patent
Sato et al.

(10) Patent No.: US 8,558,779 B2
(45) **Date of Patent: *Oct. 15, 2013**

(54) DISPLAY DEVICE

(75) Inventors: Hideo Sato, Hitachi (JP); Shigeyuki Nishitani, Mobara (JP); Takayuki Nakao, Atsugi (JP); Masahiro Maki, Mobara (JP)

(73) Assignees: Hitachi Displays, Ltd., Chiba-ken (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/556,283

(22) Filed: Jul. 24, 2012

(65) Prior Publication Data

US 2012/0287029 A1 Nov. 15, 2012

Related U.S. Application Data

(63) Continuation of application No. 11/703,161, filed on Feb. 7, 2007, now Pat. No. 8,259,055.

(30) Foreign Application Priority Data

Feb. 15, 2006 (JP) ................................ 2006-037604

(51) Int. Cl.
*G09G 3/36* (2006.01)
*G11C 19/00* (2006.01)

(52) U.S. Cl.
USPC ................ 345/100; 345/98; 345/99; 377/64; 377/72; 377/78

(58) Field of Classification Search
USPC ............. 345/87, 98–100; 377/64, 69–70, 75, 377/77–81; 326/62–92
See application file for complete search history.

(56) References Cited

U.S. PATENT DOCUMENTS 4,295,055 A * 10/1981 Takemoto et al. .............. 377/76
5,576,730 A * 11/1996 Shimada et al. ................ 345/98

(Continued)

FOREIGN PATENT DOCUMENTS

JP 03-026107 2/1991
JP 08-082786 3/1996

(Continued)

OTHER PUBLICATIONS

Notification of Reasons for Refusal issued by the Japanese Patent Office on Jul. 5, 2011, in the corresponding Japanese Patent Application No. 2006-037604 (2 pages).

*Primary Examiner* — Jonathan Horner
(74) *Attorney, Agent, or Firm* — Stites & Harbison PLLC; Juan Carlos A. Marquez, Esq.

(57) ABSTRACT

A display device comprises a driver circuit having a shift register circuit having a level conversion function is provided with a simple circuit configuration of first, second, and third basic circuits connected in tandem at multistages. A common clear signal is supplied to a control electrode of a third transistor of each basic circuit, a first clock is supplied to a control electrode of a first transistor of each of the first and third basic circuits, a second clock different in phase from the first clock is supplied to a control electrode of a first transistor of the second basic circuit, outputs of the first and second basic circuit are respectively supplied to control electrodes of second transistors of the second and third basic circuits, and an inversion output of the third basic circuit is supplied to a control electrode of a fourth transistor of the first basic circuit.

6 Claims, 6 Drawing Sheets

(56) References Cited

U.S. PATENT DOCUMENTS

| | | | | |
|---|---|---|---|---|
| 5,898,322 | A * | 4/1999 | Kubota et al. | 326/113 |
| 2003/0174115 | A1* | 9/2003 | Washio et al. | 345/98 |
| 2003/0179174 | A1* | 9/2003 | Matsuda et al. | 345/100 |

FOREIGN PATENT DOCUMENTS

| | | |
|---|---|---|
| JP | 63-023414 | 1/1998 |
| JP | 2002-287711 | * 10/2002 |

* cited by examiner

DISPLAY DEVICE

CLAIM OF PRIORITY

This application is a Continuation of U.S. application Ser. No. 11/703,161 filed on Feb. 7, 2007. Priority is claimed based on U.S. application Ser. No. 11/703,161 filed on Feb. 7, 2007, which claims priority from Japanese Application JP 2006-037604 filed on Feb. 15, 2006, the content of which is hereby incorporated by reference into this application.

BACKGROUND OF THE INVENTION

1. Field of the Invention

The present invention relates to display devices, and more particularly to a display device that is equipped with a driver circuit having a shift register circuit with a level conversion function.

2. Description of the Related Art

In general, in an active matrix liquid crystal display device using a thin film transistor (TFT: thin film transistor) as an active element, a scanning circuit is used to sequentially apply a selected scanning voltage to scanning lines.

Up to now, as a shift register circuit that is used in the above scanning circuit, there has been known a shift register circuit having a level converter circuit of the differential circuit system, for example, as disclosed in Japanese Patent Laid-Open NO. 2002-287711.

Japanese Patent Laid-Open NO. 2002-287711 discloses a related art of the present invention.

SUMMARY OF THE INVENTION

However, the level converter circuit of the differential circuit system disclosed in Japanese Patent Laid-Open NO. 2002-287711 suffers from such a problem that a space is broadened because the number of transistor elements is large, and therefore the level converter circuit cannot be applied to a liquid crystal display module that is required to narrow a frame and provide high fineness.

The present invention has been made to address the above problems with the related art, and therefore an object of the present invention is to provide a display device including a driver circuit that has a shift register circuit with a level conversion function by a simple circuit configuration.

The above and other objects and novel features of the present invention will become apparent from the description of the present specification and the attached drawings.

The typical features of the present invention described in the present application will be briefly described as follows.

(1) A display device has: a plurality of pixels; and a driver circuit that drives the plurality of pixels, wherein the driver circuit includes a shift register circuit, wherein the shift register circuit includes n (n≥2) basic circuits that are connected tandem at multistages, wherein each of the basic circuits includes: a first transistor of a second conductivity type having a first electrode to which a second supply voltage is applied; a second transistor of the second conductivity type having a first electrode connected to a second electrode of the first transistor and a second electrode connected to an output node; a third transistor of a first conductivity type having a first electrode to which a first supply voltage is applied and a second electrode connected to the output node directly or through another transistor, the first conductivity type being different from the second conductivity type; and a fourth transistor of the first conductivity type having a first electrode to which the first supply voltage is applied and a second electrode connected to the second electrode of the third transistor, wherein a clock signal is supplied to a control electrode of the first transistor, wherein a set signal is supplied to a control electrode of the second transistor, wherein a clear signal is supplied to a control electrode of the third transistor, wherein a reset signal is supplied to a control electrode of the fourth transistor, and wherein a voltage of the output node is an output of a scanning circuit.

(2) A display device has: a plurality of pixels; and a driver circuit that drives the plurality of pixels, wherein the driver circuit includes a shift register circuit, wherein the shift register circuit includes n (n≥2) basic circuits that are connected tandem at multistages, wherein each of the basic circuits includes: a first transistor of a second conductivity type having a control electrode to which a third supply voltage is applied; a second transistor of the second conductivity type having a first electrode connected to a second electrode of the first transistor and a second electrode connected to an output node; a third transistor of a first conductivity type having a first electrode to which a first supply voltage is applied and a second electrode connected to the output node directly or through another transistor, the first conductivity type being different from the second conductivity type; and a fourth transistor of the first conductivity type having a first electrode to which the first supply voltage is applied and a second electrode connected to the second electrode of the third transistor, wherein a clock signal is supplied to a first electrode of the first transistor, wherein a set signal is supplied to a control electrode of the second transistor, wherein a clear signal is supplied to a control electrode of the third transistor, wherein a reset signal is supplied to a control electrode of the fourth transistor, and wherein a voltage of the output node is an output of a scanning circuit.

(3) In the display device according to (1), the basic circuit further includes a fifth transistor of the first conductivity type having a first electrode to which the first supply voltage is applied and a second electrode connected to the second electrode of the third transistor, and a voltage resulting from inverting the voltage of the output node is applied to a control electrode of the fifth transistor.

(4) In the display device according to (1), the basic circuit further includes a sixth transistor of the first conductivity type having a first electrode connected to the second electrode of the third transistor and a second electrode connected to the output node, the set signal is supplied to the control electrode of the sixth transistor, and the second electrode of the third transistor is connected to the output node through the sixth transistor.

(5) In the display device according to (1), the basic circuit further includes a buffer circuit that is connected to the output node, and the output of the buffer circuit is the output of the scanning circuit.

(6) In the display device according to (5), the buffer circuit includes inverters that are connected tandem.

(7) In the display device according to (1), when Vck is an amplitude of the clock signal, and Vh is an amplitude of the voltage of the output node, $Vck<Vh$ is satisfied.

(8) In the display device according to (1), when Vck is an amplitude of the clock signal, and |Vth| is an absolute value of a threshold value of the first transistor, $Vck \geq |Vth|$ is satisfied.

(9) In the display device according to (1), the clock signals of odd basic circuits among the n basic circuits are first clock signals, the clock signals of even basic circuits among the n basic circuits are second clock signals, and the first clock signals and the second clock signals are identical in cycle with and different in phase from each other.

(10) The display device according to (9) further includes: a first switch element that inputs the scanning circuit output of a m-th (3≤m≤n−2) basic circuit among the n basic circuits as a set signal of a (m−1)-th basic circuit; a second switch element that inputs the scanning circuit output of the m-th basic circuit as a set signal of a (m+1)-th basic circuit; a third switch element that inputs an inversion output of the scanning circuit output of the m-th basic circuit as a reset signal of a (m−2)-th basic circuit; and a fourth switch element that inputs an inversion output of the scanning circuit output of the m-th basic circuit as a reset signal of a (m+2)-th basic circuit.

(11) In the display device according to (10), in the case where a scanning direction of the shift register circuit is a first direction, the first switch element and the third switch element are turned on, and the second switch element and the fourth switch element are turned off, and in the case where a scanning direction of the shift register circuit is a second direction, the first switch element and the third switch element are turned off, and the second switch element and the fourth switch element are turned on.

The advantages obtained by the typical features of the present invention described in the present application will be briefly described as follows.

According to the present invention, it is possible to provide a display device that is equipped with a driver circuit having a shift register circuit with a level conversion function by a simple circuit configuration.

BRIEF DESCRIPTION OF THE DRAWINGS

These and other objects and advantages of this invention will become more fully apparent from the following detailed description taken with the accompanying drawings in which.

DETAILED DESCRIPTION OF THE PREFERRED EMBODIMENTS

Now, a description will be given in more detail of preferred embodiments of the present invention with reference to the accompanying drawings.

In all of drawings for explaining the embodiment, parts having the same functions are denoted by identical symbols, and their duplicated description will be omitted.

Figure 1:
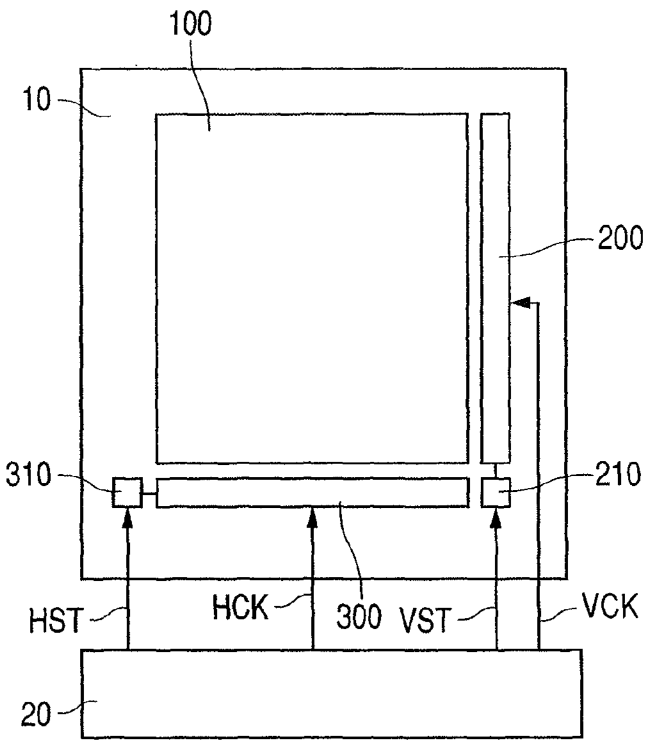
FIG. 1 is a block diagram showing the outline configuration of a liquid crystal display module according to an embodiment of the present invention.

FIG. 1 is a block diagram showing the outline configuration of a liquid crystal display module according to an embodiment of the present invention.

In the drawing, reference numeral 10 denotes a liquid crystal display panel, and 20 is a control circuit. The liquid crystal display panel 10 includes a display section 100, a gate circuit 200, a level converter circuit 210 of the gate circuit 200, a drain circuit 300, and a drain converter circuit 310 of the drain circuit 300.

The control circuit 20 outputs a start signal (VST) of the gate circuit 200, a clock signal (VCK), a start signal (HST) of the drain circuit, and a clock signal (HCK). In this example, the above-described signals (VST, VCK, HST, HCK) are low voltage signals, for example, signals that are 3 V in amplitude.

Figure 2:
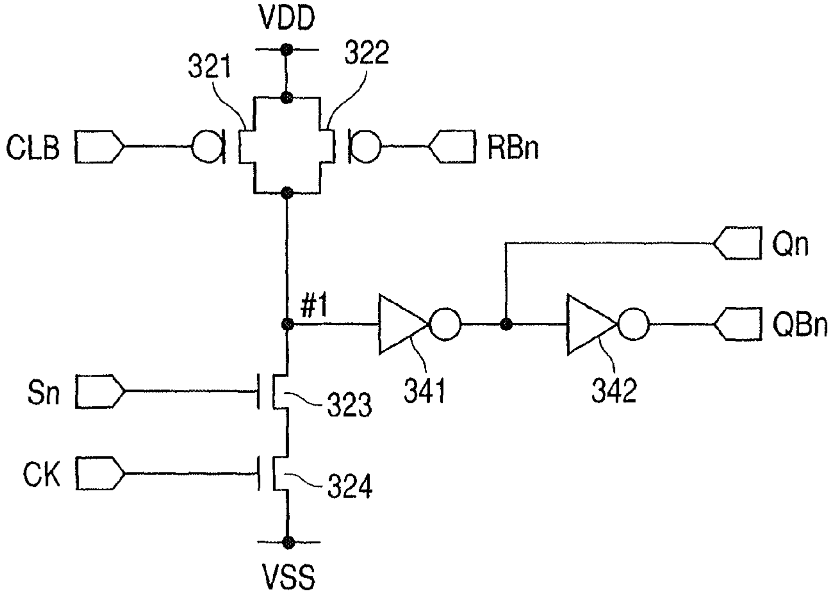
FIG. 2 is a circuit diagram for explaining a basic circuit of a shift register circuit according to the embodiment of the present invention.

FIG. 2 is a circuit diagram for explaining a basic circuit of a shift register circuit according to the embodiment of the present invention, and a circuit diagram for explaining the basic circuit of the shift register circuit that is applied to the gate circuit 200 or the drain circuit 300 shown in FIG. 1.

As shown in FIG. 2, the basic circuit of the shift register circuit according to this embodiment is made up of p-type MOS transistors (321, 322), n-type MOS transistors (323, 324), and inverters (341, 342).

The p-type MOS transistor 321 has a source connected to a first supply voltage (VDD), a drain connected to a node (#1: output node), and a gate to which a clear signal (CLB) is supplied.

The p-type MOS transistor 322 has a source connected to a first supply voltage (VDD), a drain connected to a node (#1), and a gate to which a reset signal (RBn) is supplied.

The n-type MOS transistor 323 has a drain connected to the node (#1) and a gate to which a set signal (Sn) is supplied.

The n-type MOS transistor 324 has a drain connected to the source of the n-type MOS transistor 323, a source connected to a second supply voltage (VSS), and a gate to which a clock signal (CK) is supplied.

The node (#1) is connected with the inverter 341 and the inverter 342 which are connected tandem, an output of the inverter 341 becomes an output (Qn), and an output of the inverter 342 becomes an inversion output (QBn) of the output (Qn). The inverter 341 and the inverter 342 constitute a buffer circuit.

The p-type MOS transistors (321, 322), the n-type MOS transistors (323, 324), and the p-type MOS transistor and the n-type MOS transistor which constitute the inverters (341, 342) as described above are formed of thin film transistors each having a semiconductor layer made of polysilicon.

Also, the gate circuit 200 and the drain circuit 300 in FIG. 1 constitute circuits within the liquid crystal display panel, and each of those circuits is formed of a semiconductor layer having a semiconductor layer made of polysilicon as with the p-type MOS transistors (321, 322) and the n-type MOS transistors (323, 324) as described above. Those thin film transistors are formed together with the thin film transistors of the pixels.

Figure 3:
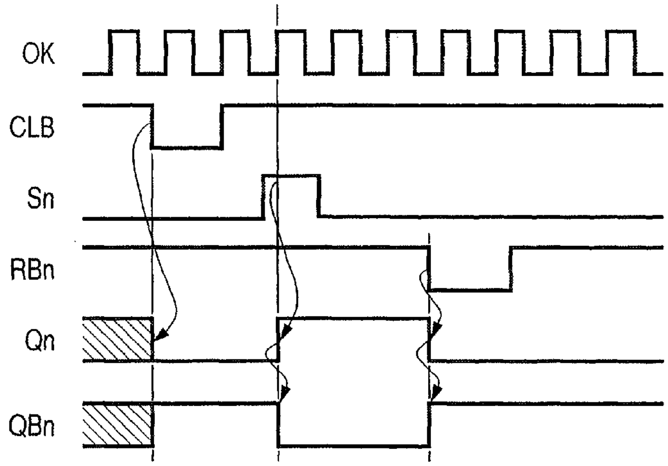
FIG. 3 is a timing chart for explaining the operation of a basic circuit shown in FIG. 2.

FIG. 3 is a timing chart for explaining the operation of the basic circuit shown in FIG. 2.

The clock signal (CK) is a low voltage signal, for example, a signal that is 3 V in amplitude. The clear signal (CLB), the set signal (Sn), the reset signal (RBn), the output (Qn), the inversion output (QBn) are high voltage signals, for example, signals that are 10 V in amplitude.

When the clear signal (CLB) becomes a low level (hereinafter referred to as "L level"), the p-type MOS transistor 321 turns on, the potential of the node (#1) becomes a high level (hereinafter referred to as "H level"), the output (Qn) becomes the L level, and the inversion output (QBn) becomes the H level. In this example, even if the clear signal (CLB) is the H level, the node (#1) maintains the potential of the H level.

When the clear signal (CLB) becomes the H level, the set signal (Sn) becomes H level, and the clock signal (CK) becomes H level, the n-type MOS transistors (323, 324) turn on, and the inversion output (QBn) becomes the L level. Even if the clock signal (CK) is the L level, the node (#1) maintains the potential of the L level.

Subsequently, when the set signal (Sn) becomes the L level, and the reset signal (RBn) becomes the L level, the p-type MOS transistor 322 turns on, the output (Qn) becomes the L level, and the inversion output (QBn) becomes the H level.

In the basic circuit according to this embodiment, since the n-type MOS transistor 324 is a grounded base, the n-type MOS transistor 324 turns on when a voltage higher than the threshold voltage (Vth) is supplied to the gate of the n-type MOS transistor 324.

In other words, because the H level of the clock signal (CK) allows the n-type MOS transistor 324 to turn on and is not connected to the p-type MOS transistor, it is possible to set the potential of another H level different from the first supply voltage (VDD).

For example, since the threshold voltage of the n-type MOS transistor 324 is set to, for example, 0 to 2 V, it is possible to set the amplitude of the clock signal (CK) to 3 V.

That is, when the amplitude of the clock signal (CK) is Vck (>0), and a potential difference between the first supply voltage (VDD) and the second supply voltage (VSS) is Vh (>0), the basic circuit of this embodiment is operable when $Vck \geq |Vth|$ and $Vh \geq Vck$ are satisfied.

This exhibits that the H level potential of the clock signal (CK) with the low amplitude can be directly increased to the higher VDD potential ($Vck<Vh$), that is, the basic circuit according to this embodiment has the level shift function.

In the related circuit configuration, it is necessary that the H level of the clock signal (CK) is basically made identical in the potential with the first supply voltage (VDD), and the L level of the clock signal (CK) is basically made identical in the potential with the second supply voltage (VSS). For that reason, when the supply voltage increases, the amplitude of the clock signal (CK) is also amplified.

Because the power consumption in charging and discharging a capacity is proportional to the second power of the voltage, the amplification of the amplitude of the clock signal (CK), that is, an increase in the supply voltage leads to an increase in the power consumption.

In the shift register circuit, the electric power is mainly consumed by charging and discharging of the clock bus capacity. In the basic circuit according to this embodiment shown in FIG. 2, since the supply voltage of the shift register circuit can be increased without increasing the amplitude of the clock signal (CK), it is possible to suppress an increase in the power consumption.

Figure 4:
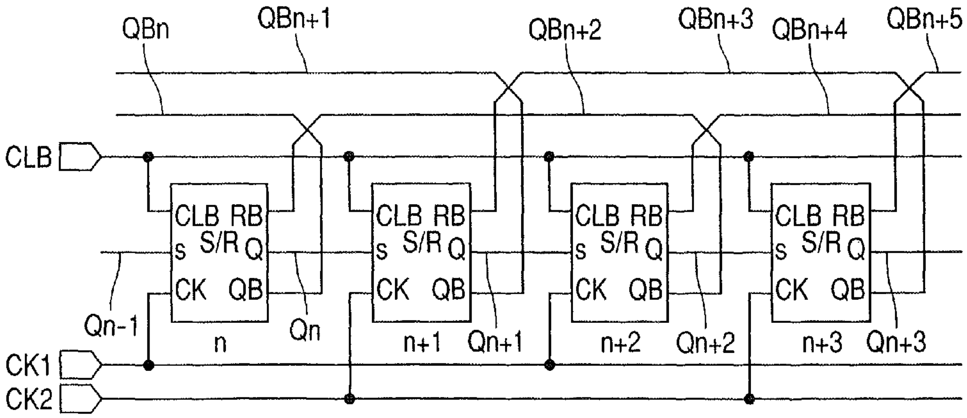
FIG. 4 is a diagram showing the circuit configuration of a shift register circuit that is formed of the basic circuits shown in FIG. 2.

FIG. 4 is a diagram showing the circuit configuration of a shift register circuit that is formed of the basic circuits (S/R) shown in FIG. 2. FIG. 4 shows an example of four stages of n to (n+3).

In this example, when a clock signal (CK1) and a clock signal (CK2) which are clock signals reversed in phase to each other are inputted to the CK terminals of odd basic circuits (S/R) and the CK terminals of even basic circuits (S/R), the clock signals are sequentially transferred so as to function as the shift register circuit.

The common clear signal (CLB) is supplied to the CLB terminals of the respective basic circuits (S/R), a pre-stage output (Qn−1) is supplied to the S terminals of the respective basic circuits (S/R) as the set signal, and a stage-after-next inversion output (QBn+2) is supplied to the RB terminals of the respective basic circuits (S/R) as the reset signal.

Figure 5:
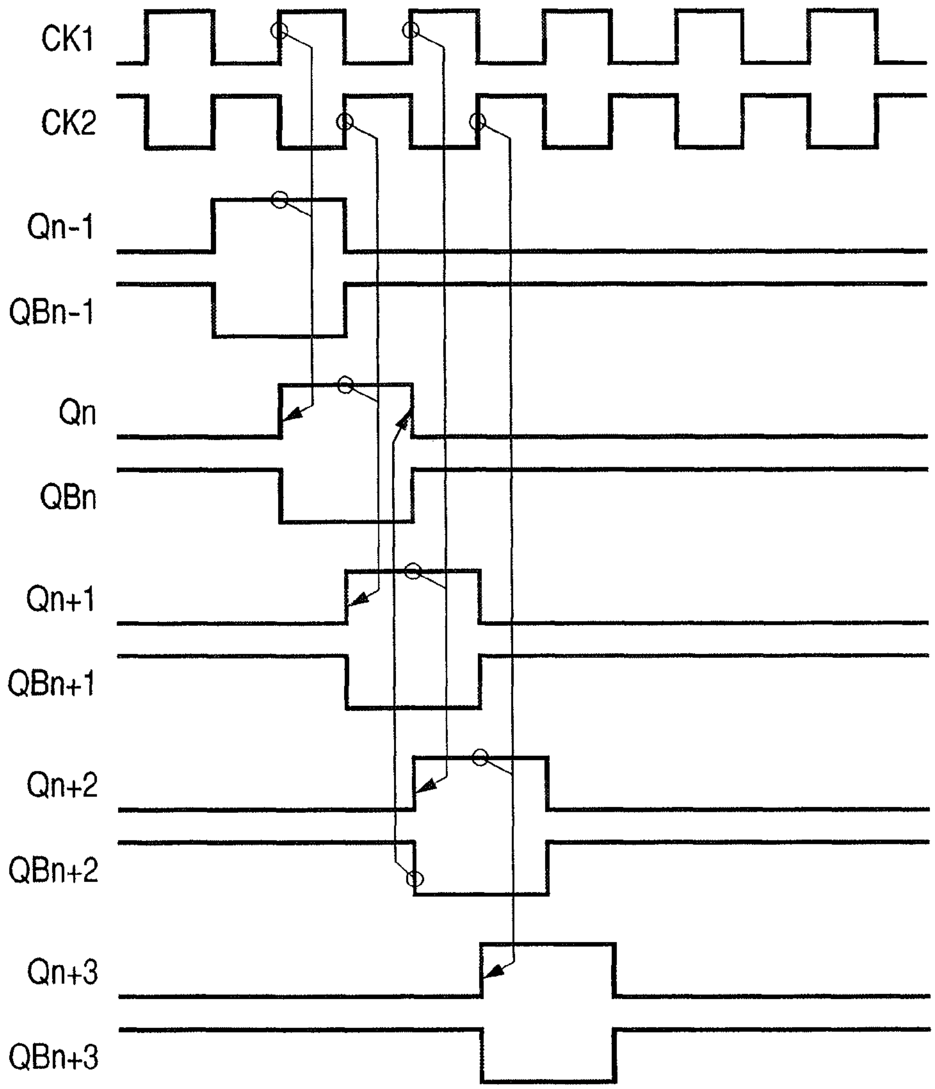
FIG. 5 is a timing chart for explaining the operation of the shift register circuit shown in FIG. 4.

FIG. 5 is a timing chart for explaining the operation of the shift register circuit shown in FIG. 4.

The output (Qn) of the n-th basic circuit (S/R) becomes the H level at a timing when both of the output (Qn−1) of the (n−1)-th basic circuit (S/R) and the clock signal (CK1) become the H level.

The output (Qn+1) of the (n+1)-th basic circuit (S/R) becomes the H level at a timing when both of the output (Qn) of the n-th basic circuit (S/R) and the clock signal (CK2) become the H level. Also, the output (Qn+2) of the (n+2)-th basic circuit (S/R) becomes the H level at a timing when both of the output (Qn+1) of the (n+1)-th basic circuit (S/R) and the clock signal (CK1) become the H level.

When the output (Qn+2) of the (n+2)-th basic circuit (S/R) becomes the H level, since the inversion output (QBn+2) becomes the L level, the output (Qn) of the n-th basic circuit (S/R) becomes the L level at that timing. As a result, it is possible to obtain the output different in the phase as shown in FIG. 5.

Figure 6:
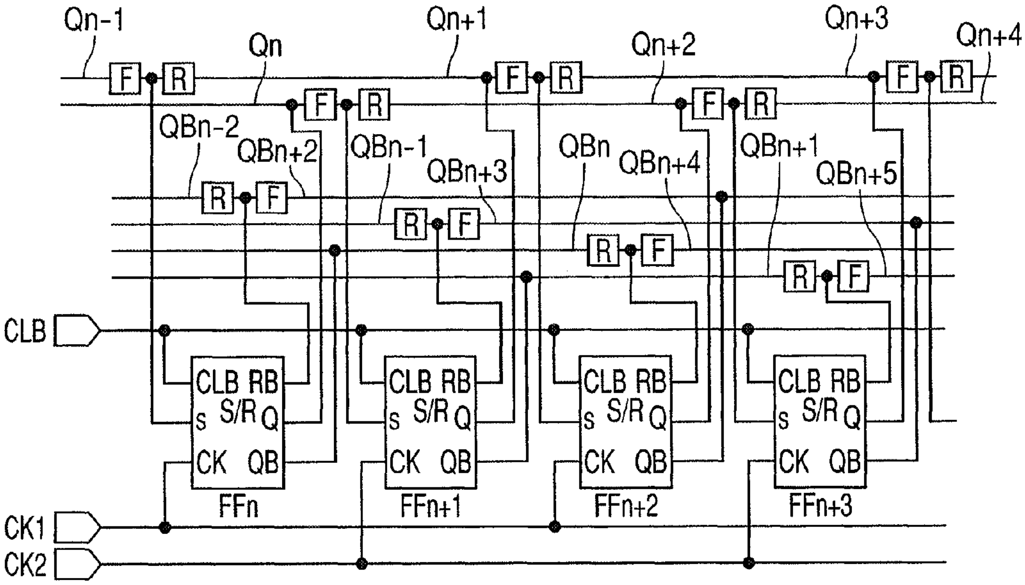
FIG. 6 is a diagram showing the circuit configuration of a bidirectional shift register circuit that is formed of the basic circuits shown in FIG. 2.

FIG. 6 is a diagram showing the circuit configuration of a bidirectional shift register circuit that is made up of the basic circuits (S/R) shown in FIG. 2.

Referring to FIG. 6, reference F and R denote switch elements that change over scanning directions. The bidirectional shift register circuit shown in FIG. 6 is different from the shift register circuit shown in FIG. 4 in the following configurations. That is, first, the terminal (Q) of the n-th basic circuit (S/R) is connected to the terminal (S) of the (n+1)-th basic circuit (S/R) through the switch element (F), and also connected to the terminal (S) of the (n−1)-th basic circuit (S/R) through the switch element (R). Second, the terminal (QB) of the n-th basic circuit (S/R) is connected to the terminal (RB) of the (n−2)-th basic circuit (S/R) through the switch element (F), and also connected to the terminal (RB) of the (n+2)-th basic circuit (S/R) through the switch element (R).

In the bidirectional shift register circuit shown in FIG. 6, in the case where scanning is conducted from the left toward the right, the switch element (F) turns on, and the switch element (R) turns off. On the other hand, in the case where scanning is conducted from the right toward the left, the switch element (R) turns on, and the switch element (F) turns off.

The switch elements (F, R) are changed over in such a manner that when the switch element (F) is turned on, the output (Qn−1) of the previous stage is inputted as the set signal (Sn) of the n-th basic circuit (S/R), and the inversion output (QBn+2) of the stage after next is inputted as the reset signal (RBn). Also, when the switch element (R) is turned on, the output (Qn+1) of the previous stage is inputted as the set signal (Sn) of the n-th basic circuit (S/R), and the inversion output (QBn−2) of the stage after next is inputted as the reset signal (RBn).

Figure 7:
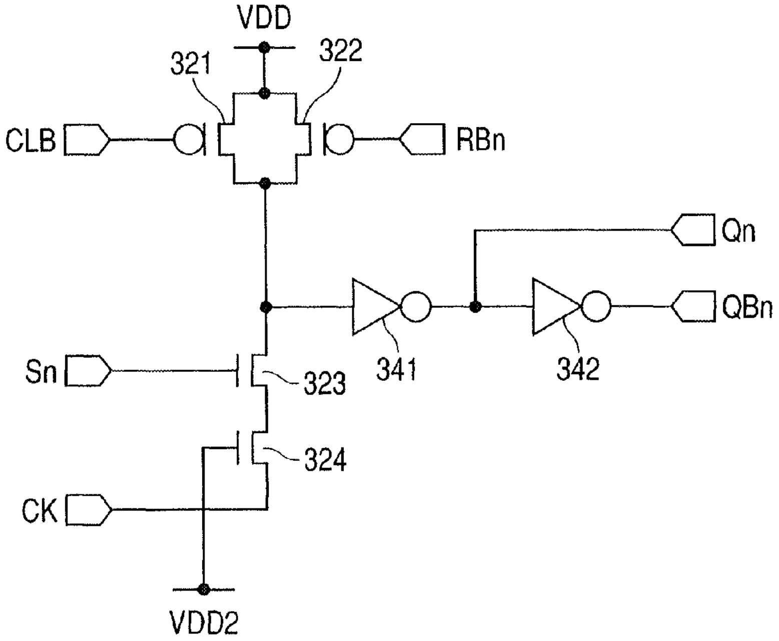
FIG. 7 is a circuit diagram for explaining a first modified example of the basic circuit of the shift register circuit according to the embodiment of the present invention.

FIG. 7 is a circuit diagram for explaining a first modified example of the basic circuit of the shift register circuit according to the embodiment of the present invention.

The basic circuit shown in FIG. 7 is different in the basic circuit shown in FIG. 2 in the connection configuration of an n-type MOS transistor 324.

In the basic circuit shown in FIG. 7, a third supply voltage (VDD2) is applied to a gate of the n-th MOS transistor 324, and a clock signal (CK) is supplied to a source thereof. In this example, the third supply voltage (VDD2) is, for example, 3V.

The n-type MOS transistor 324 turns on when the clock signal (CK) is the L level, and turns off when the clock signal (CK) is the H level.

Figure 8:
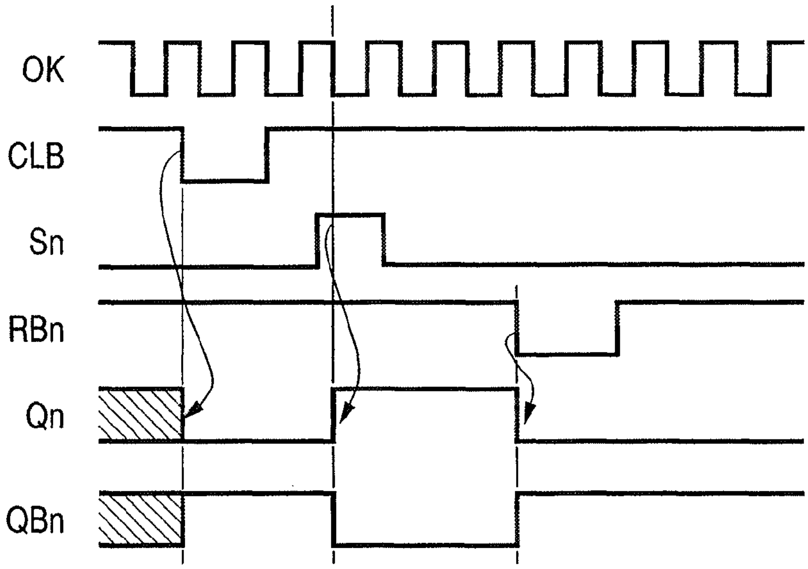
FIG. 8 is a timing chart for explaining the operation of the basic circuit shown in FIG. 7.

FIG. 8 is a timing chart for explaining the operation of th basic circuit shown in FIG. 7.

The output (Qn) is changed to the H level when the set signal (Sn) is the H level and the clock signal (CK) is the L level. The operation is different from that of the basic circuit shown in FIG. 2.

In the basic circuit shown in FIG. 7, because the clock signal (CK) is supplied to the source of the n-th MOS transistor 324, the load capacity of lines to which the clock signal is supplied can be reduced, thereby making it possible to realize the shift register circuit with the lower power consumption.

In addition, when the third supply voltage (VDD2) is selected in correspondence with the threshold voltage of the n-type MOS transistor 324, thereby making it possible to realize the shift register circuit that can be operated at the higher speed. For example, in the case where the threshold voltage is 1V, and the amplitude of the clock signal is 3V, the third supply voltage (VDD2) is set to 4 V. Since this setting allows a voltage between the gate and source of the n-type MOS transistor 324 to be increased to 4 V, the shift register circuit with the high-speed operation can be realized.

Figure 9:
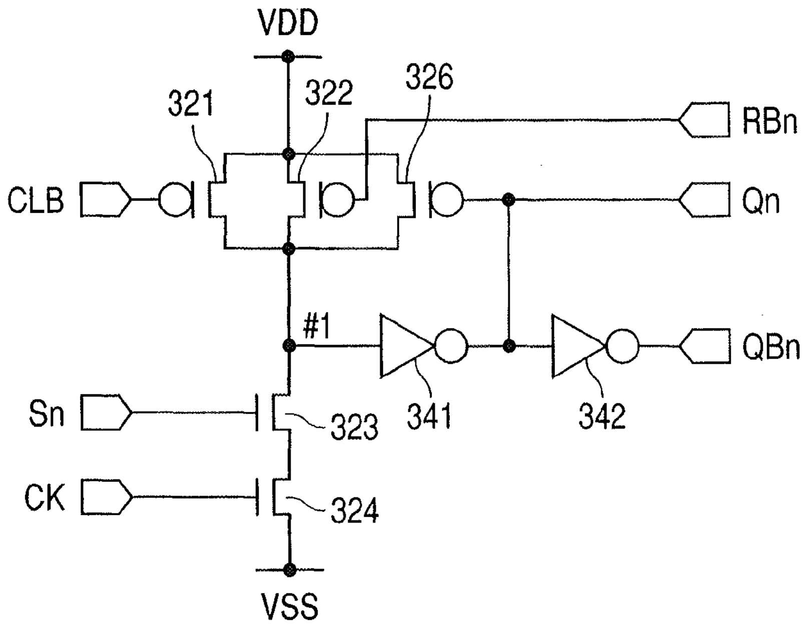
FIG. 9 is a circuit diagram for explaining a second modified example of the basic circuit of the shift register circuit according to the embodiment of the present invention.

FIG. 9 is a circuit diagram for explaining a second modified example of the basic circuit of the shift register circuit according to the embodiment of the present invention. The basic circuit shown in FIG. 9 is different from the basic circuit shown in FIG. 2 in that a p-type MOS transistor 326 is added.

As shown in FIG. 9, the p-type MOS transistor 326 has a source connected to the first supply voltage (VDD), a drain connected to the node (#1), and a gate to which the output (Qn) is supplied.

The p-type MOS transistor 326 turns on when the output (Qn) is the L level, so as to prevent the potential of the node (#1) from being varied due to the leakage current of the p-type MOS transistors (321, 322, 326) or the n-type MOS transistor 323.

Figure 10:
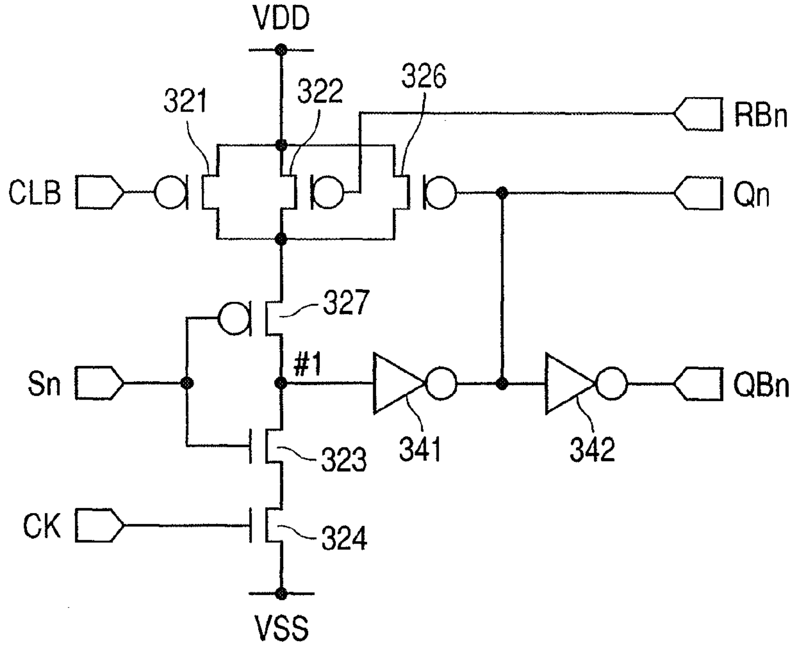
FIG. 10 is a circuit diagram for explaining a third modified example of the basic circuit of the shift register circuit according to the embodiment of the present invention.

FIG. 10 is a circuit diagram for explaining a third modified example of the basic circuit of the shift register circuit according to the embodiment of the present invention. The basic circuit shown in FIG. 10 is different from the basic circuit shown in FIG. 9 in that a p-type MOS transistor 327 is added.

As shown in FIG. 10, the p-type MOS transistor 327 has a source connected to the drain of the p-type MOS transistors (321, 322, 326), a drain connected to the node (#1), and a gate to which a set signal (Sn) is supplied. The p-type MOS transistor 326 is not essential.

Since the p-type MOS transistor 327 turns off when the set signal (Sn) is the H level, it is possible to set the potential of the node (#1) to the L level more quickly.

For that reason, in the basic circuit shown in FIG. 10, it is possible to realize the shift register that operates at the higher frequency.

Only the respective modified parts of the modified examples shown in FIGS. 7 to 10 can be combined together, for example, the first modified example and the third modified example can be combined together.

Figure 11:
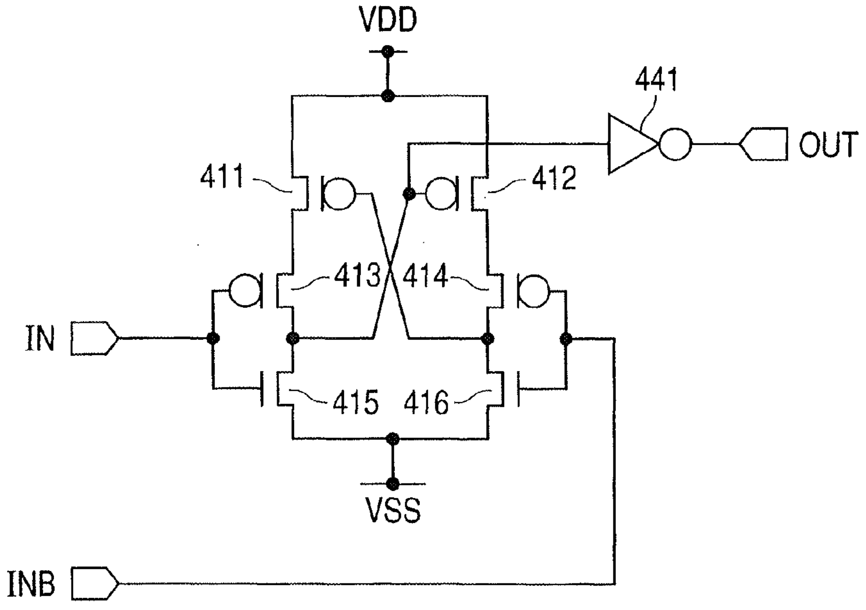
FIG. 11 is a circuit diagram showing an example of the circuit configuration of the level converter circuit shown in FIG. 1.

FIG. 11 is a circuit showing an example of the circuit configuration of the level converter circuits (210, 310) shown in FIG. 1.

The level converter circuit shown in FIG. 11 is made up of p-type (411 to 414), n-type MOS transistors (415, 416), and an inverter 441.

The circuit system is a so-called cross type level converter circuit which inputs a signal (IN) of the low voltage signal and the inversion signal (INB) and outputs the signal (OUT) of the high voltage signal. As a result, the level converter circuit converts start signals (VST, HST) in level, and input the converted signals to the basic circuit of the first stage.

As described above, according to this embodiment, since the shift register circuit that operates due to the low-voltage clock signal (CK) can be realized by a small number of transistor elements, it is possible to realize the liquid crystal display panel with the reduced circuit occupied area, the narrowed frame, and the high fineness.

Also, since the input load of the clock signal can be reduced with the decreased voltage of the clock signal, it is possible to reduce the power consumption.

All of the n-type MOS transistors are replaced with p-type MOS transistors, all of the p-type MOS transistors are replaced with n-type MOS transistors, the first supply voltage (VDD) and the second supply voltage (VSS) are replaced with each other, and the logic of the input signal is replaced, to thereby constitute a CMOS shift register circuit that operates due to the inversion logic.

In the above description, MOS (metal oxide semiconductor) type TFT is used as the transistor. Alternatively, MIS (metal insulator semiconductor) FET can be used.

Also, in the above description, the gate circuit 200 or the drain circuit 300 is incorporated into the liquid crystal display panel 10 (integrated with the substrate of the liquid crystal display panel). However, the present invention is not limited to the above configuration, but the gate circuit 200 or the drain circuit 300 per se, or partial functions thereof can be structured by a semiconductor chip.

In addition, in the above description, the present invention is applied to the liquid crystal display module. However, the present invention is not limited to the above configuration, and it is needless to say that the present invention is applicable to an EL display device using an organic EL element.

The present invention that has been made by the present inventors has been described in more detail with reference to the above embodiments, but the present invention is not limited to the above embodiments, and can be variously modified within a scope that does not deviate from the sprit of the invention.

What is claimed is:

1. A display device comprises:

a plurality of pixels formed on a substrate; and a driver circuit that drives the plurality of pixels, wherein the driver circuit includes a shift register circuit, the shift register circuit includes a first basic circuit, a second basic circuit, and a third basic circuit that are connected in tandem at multi stages, and each of the first, second, and third basic circuits includes:

a first transistor of a second conductivity type having a control electrode to which a second supply voltage is applied;

a second transistor of the second conductivity type having a first electrode connected to a second electrode of the first transistor and a second electrode connected to an output node;

a third transistor of a first conductivity type having a first electrode to which a first supply voltage is applied and a second electrode connected to the output node directly or through another transistor, the first conductivity type being different from the second conductivity type; and a fourth transistor of the first conductivity type having a first electrode to which the first supply voltage is applied and a second electrode connected to the second electrode of the third transistor, a clock signal is supplied to a first electrode of the first transistor, a set signal is supplied to a control electrode of the second transistor, a reset signal is supplied to a control electrode of the fourth transistor, and a voltage of the output node is an output of a scanning circuit, and wherein a common clear signal is supplied to respective control electrode of the third transistor of each of the first, second, and third basic circuits, a first clock is supplied to a respective first electrode of the first transistor of each of the first and third basic circuits, a second clock that is different in phase from the first clock is supplied to a first electrode of the first transistor of the second basic circuit, an output of the first basic circuit is supplied as the set signal to a control electrode of the second transistor of the second basic circuit, an output of the second basic circuit is supplied as the set signal to a control electrode of the second transistor of the third basic circuit, and an inversion output of the third basic circuit is supplied to a control electrode of the fourth transistor of the first basic, circuit, and wherein each of the first, second, third, and fourth transistors of each of the first, second, and third basic circuits comprises a semiconductor layer made of polysilicon formed on the substrate.

2. The display device according to claim 1, wherein each of the first, second, and third basic circuits further comprises a fifth transistor of the first conductivity type having a first electrode to which the first supply voltage is applied and a second electrode connected to the second electrode of the third transistor, and a voltage resulting from inverting the voltage of the output node is applied to a control electrode of the fifth transistor of each of the first, second, and third basic circuits.

3. The display device according to claim 1, wherein each of the first, second, and third basic circuits further comprises a sixth transistor of the first conductivity type having a first electrode connected to the second electrode of the third transistor and a second electrode connected to the output node, and wherein a control electrode of the sixth transistor of each of the first, second, and third basic circuits is connected to the control electrode of the second transistor, the set signal is supplied to the control electrode of the sixth transistor of each of the first, second, and third basic circuits, and the second electrode of the third transistor of each of the first, second, and third basic circuits is connected to the output node through the sixth transistor.

4. The display device according to claim 1, wherein each of the first, second, and third basic circuits further comprises a buffer circuit that is connected to the output node, and the output of the buffer circuit is the output of the scanning circuit.

5. The display device according to claim 4, wherein the buffer circuit of each of the first, second, and third basic circuits includes inverters that are connected in tandem.

6. The display device according to claim 1, wherein for each of the first, second, and third basic circuits, when Vck is an amplitude of the clock signal, and Vh is an amplitude of the voltage of the output node, $Vck<Vh$ is satisfied.

* * * * *